(12) United States Patent
Keller et al.

(10) Patent No.: US 7,076,752 B2
(45) Date of Patent: Jul. 11, 2006

(54) SYSTEM AND METHOD FOR DETERMINING UNMATCHED DESIGN ELEMENTS IN A COMPUTER-AUTOMATED DESIGN

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 158 days.

(21) Appl. No.: 10/647,608

(22) Filed: Aug. 25, 2003

(65) Prior Publication Data

US 2005/0050493 A1   Mar. 3, 2005

(51) Int. Cl.
    *G06F 17/50*   (2006.01)
(52) U.S. Cl. .......................................... 716/5
(58) Field of Classification Search ............. 716/1, 716/3–6, 18, 5
    See application file for complete search history.

(56) References Cited

U.S. PATENT DOCUMENTS

| | | |
|---|---|---|
| 5,249,133 A | 9/1993 | Batra |
| 5,301,318 A | 4/1994 | Mittal |
| 5,812,416 A | 9/1998 | Gupte et al. |
| 5,825,660 A | 10/1998 | Cagan et al. |
| 5,831,869 A | 11/1998 | Ellis et al. |
| 5,946,218 A | 8/1999 | Taylor et al. |
| 5,949,691 A * | 9/1999 | Kurosaka et al. ............ 716/5 |
| 6,028,991 A | 2/2000 | Akashi |
| 6,185,722 B1 | 2/2001 | Darden et al. |
| 6,230,299 B1 | 5/2001 | McSherry et al. |
| 6,272,671 B1 | 8/2001 | Fakhry |
| 6,308,301 B1 | 10/2001 | McBride et al. |
| 6,308,304 B1 | 10/2001 | Devgan et al. |
| 6,363,516 B1 | 3/2002 | Cano et al. |

(Continued)

FOREIGN PATENT DOCUMENTS

EP   0582918 A2   2/1994

(Continued)

OTHER PUBLICATIONS

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; Filed Nov. 12, 2003.

(Continued)

*Primary Examiner*—Vuthe Siek

(57) ABSTRACT

A system and method for determining unmatched design elements in a circuit. The system determines instances of a first type and a second type of the design elements that are connected to a specific node in the circuit, and stores the gate signal name for each determined said occurrence of the first type of design element in a first list. The gate signal name for each determined said occurrence of the second type of design element is than stored in a second list. A value of a design element characteristic and indicia thereof for each determined said occurrence of the first and the second types of the design elements is than stored. A set difference operation is preformed on the first list and the second list to determine orphan gate signal names that appear in only one said list; and a cumulative value is determined for each said design element characteristic, by adding the design element characteristic value corresponding to each stored said orphan gate signal name, to produce a total design element characteristic value.

15 Claims, 2 Drawing Sheets

U.S. PATENT DOCUMENTS

| | | | |
|---|---|---|---|
| 6,378,123 | B1 | 4/2002 | Dupenloup |
| 6,480,987 | B1 | 11/2002 | McBride |
| 6,490,717 | B1* | 12/2002 | Pedersen et al. ............. 716/18 |
| 6,493,864 | B1 | 12/2002 | Liu |
| 6,523,149 | B1 | 2/2003 | Mehrotra et al. |
| 6,526,562 | B1 | 2/2003 | Haddad et al. |
| 6,531,923 | B1* | 3/2003 | Burns ....................... 330/296 |
| 6,587,999 | B1 | 7/2003 | Chen et al. |
| 6,598,211 | B1 | 7/2003 | Zachariah et al. |
| 6,751,782 | B1* | 6/2004 | Levin et al. .................. 716/1 |
| 6,772,404 | B1 | 8/2004 | Tanaka |
| 6,801,884 | B1 | 10/2004 | Ferreri et al. |
| 6,807,520 | B1 | 10/2004 | Zhou et al. |
| 6,836,877 | B1 | 12/2004 | Dupenloup |
| 6,931,613 | B1 | 8/2005 | Kauth et al. |
| 2002/0002701 | A1 | 1/2002 | Usami et al. |
| 2002/0010901 | A1 | 1/2002 | Otaguro |
| 2002/0023255 | A1 | 2/2002 | Kamiewicz |
| 2002/0144219 | A1 | 10/2002 | Zachariah et al. |
| 2003/0051222 | A1 | 3/2003 | Williams et al. |
| 2003/0200519 | A1 | 10/2003 | Argyres |
| 2003/0208721 | A1 | 11/2003 | Regnier |
| 2003/0221173 | A1 | 11/2003 | Fisher |
| 2003/0237067 | A1 | 12/2003 | Mielke et al. |
| 2004/0044972 | A1 | 3/2004 | Rohrbaugh et al. |
| 2004/0078767 | A1 | 4/2004 | Burks et al. |
| 2004/0199880 | A1 | 10/2004 | Kresh et al. |

FOREIGN PATENT DOCUMENTS

JP            07334532 A     12/1995

OTHER PUBLICATIONS

Keller, S. Brandon; Rogers, Dennis R.; Lelm, Charles A.; U.S. Appl. No. 10/706,698, Entitled: Method And Program Product For Performing Self-Heating Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; Filed Nov. 12, 2003.

Keller, S. Brandon; Rogers, Dennis R.; Lelm, Charles A.; U.S. Appl. No. 10/706,501, Entitled: Method And Program Product For Performing Electromigration Analysis In A Digital Integrated Circuit By Converting A Netlist To A DC Model And Performing DC Analysis Of The DC Model; Filed Nov. 12, 2003.

Keller, S. Brandon; Rogers, Dennis R.; Lelm, Charles A.; U.S. Appl. No. 10/706,526, Entitled: Method And Program Product For Performing A Worst Case Electromigration And Self Heating Analysis In A Digital Integrated Circuit With Worst-Case Superposition Of Partial Currents; Filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,508, Entitled: Method And Program Product For Performing Self-Heating Analysis In A Digital Integrated Circuit Layout Database by Substituting Resistive Models For Active Devices; Filed Nov. 12, 2003.

Keller, S. Brandon; Rogers, Dennis R.; Robberts, George H.; U.S. Patent Application filed under EV210655516US; Entitled: Method And Program Product For Determining Worst Case Currents In A Digital Integrated Circuit Through Worst-Case Superposition Of Partial Currents; Filed Jan. 30, 2004.

Keller, S. Brandon; Rogers, Dennis R.; Robberts, George H.; U.S. Patent Application filed under EV210655564US; Entitled: Systems And Methods For Re-Using Circuit Design Analysis Results; Filed Jan. 30, 2004.

Keller, S. Brandon; Rogers, Dennis R.; Robberts, George H.; U.S. Patent Application filed under EV210655581US; Entitled: System And Method For Determining Detail Of Analysis In A Circuit Design; Filed Jan. 30, 2004.

Keller, S. Brandon; Rogers, Dennis R.; Robberts, George H.; U.S. Patent Application filed under EV210655595US; Entitled: Systems And Methods That Identify Equivalent Instantiation-Specific Configuration Information For Analysis Tools; Filed Jan. 30, 2004.

Keller, S. Brandon; Rogers, Dennis R.; Robberts, George H. & Stevens, Scott Alan; U.S. Patent Application filed under EV210655520US; Entitled: System and Method To Limit Analyzed Current Flow In A Circuit Design; Filed Jan. 30, 2004.

Keller, S. Brandon; Rogers, Dennis R.; Robberts, George H.; U.S. Patent Application filed under EV210655533US; Entitled: System And Method For Processing Configuration Information; Filed Jan. 30, 2004.

Keller, S. Brandon; Rogers, Dennis R.; Robberts, George H.; U.S. Patent Application filed under EV210655555US; Entitled: System And Method For Balancing Run-Time And Result Accuracy In A Circuit Design Analysis Tool; Filed Jan. 30, 2004.

Keller, S. Brandon; Rogers, Dennis R.; Robberts, George H.; U.S. Patent Application filed under EV210655578US; Entitled: System And Method For Indicating Logic State Combinations Used During Circuit Design Analysis; Filed Jan. 30, 2004.

Keller, S. Brandon; Rogers, Dennis R.; Robberts, George H.; U.S. Patent Application filed under EV210655547US; Entitled: System And Method For Determining Control Signal Combinations For Use During Simulation Of A Stage Of A Circuit Design; Filed Jan. 30, 2004.

* cited by examiner

SYSTEM AND METHOD FOR DETERMINING UNMATCHED DESIGN ELEMENTS IN A COMPUTER-AUTOMATED DESIGN

RELATED APPLICATIONS

The present document contains material related to the material of copending, cofiled, U.S. patent application Ser. No. 10/647,597, entitled System And Method For Determining Wire Capacitance For A VLSI Circuit; U.S. patent application Ser. No. 10/647,595, entitled System And Method For Determining Applicable Configuration Information For Use In Analysis Of A Computer Aided Design; U.S. patent application Ser. No. 10/647,687, entitled Systems And Methods Utilizing Fast Analysis Information During Detailed Analysis Of A Circuit Design; U.S. patent application Ser. No. 10/647,594, entitled Systems And Methods For Determining Activity Factors Of A Circuit Design; U.S. patent application Ser. No. 10/647,768, entitled System And Method For Determining A Highest Level Signal Name In A Hierarchical VLSI Design; U.S. patent application Ser. No. 10/647,606, entitled System And Method For Determining Connectivity Of Nets In A Hierarchical Circuit Design; U.S. patent application Ser. No. 10/647,596, entitled System And Method Analyzing Design Elements In Computer Aided Design Tools; U.S. patent application Ser. No. 10/647,598, entitled Computer Aided Design Systems And Methods With Reduced Memory Utilization; U.S. patent application Ser. No. 10/647,688, entitled System And Method For Iteratively Traversing A Hierarchical Circuit Design; U.S. patent application Ser. No. 10/647,769, entitled Systems And Methods For Establishing Data Model Consistency Of Computer Aided Design Tools; U.S. patent application Ser. No. 10/647,607, entitled Systems And Methods For Identifying Data Sources Associated With A Circuit Design; and U.S. patent application Ser. No. 10/647,605, entitled Systems And Methods For Performing Circuit Analysis On A Circuit Design, the disclosures of which are hereby incorporated herein by reference.

BACKGROUND

In a circuit consisting of P- and N-type FETs (Field Effect Transistors), a condition called a 'drive fight' can exist when both a P-FET and an N-FET that share a common net connection are turned on, thus creating a path from a voltage rail (e.g., VDD) to ground. This drive fight is undesirable from a power consumption standpoint, since it means that current essentially flows directly from the positive supply rail to the negative one through the FETs, and is therefore a waste of current. Both the P-FET and N-FET may be a stack of channel connected FETs, as long as the stacks share a common node. One way to avoid drive fights is to use complementary FET logic, which means that for every P-FET in the logic gate, there is an N-FET that shares the same input signal, such that when the P-FET is on, the N-FET is off, and vice versa. This complementary FET logic prevents drive fight conditions. However, complementary (e.g., CMOS) logic can be slow, so 'dynamic logic' may be employed to enhance circuit performance. Dynamic logic basically consists of a P-FET that pulls the output of the logic gate high, and some sort of tree of N-FETs connected to the P-FET that can pull the node low if necessary. A problem with dynamic logic is that if there is no corresponding N-FET in each branch of the tree for each P-FET, then a drive fight condition results. Therefore, what is needed is a method for identifying situations where a drive fight can occur, and also for determining the amount of current that the drive fight sinks.

SUMMARY

The present system attempts to find situations where a drive fight can occur in a circuit, and determines the relative area of FETs that are drive fighting, to determine the amount of current that the drive fight sinks. The system determines instances of a first type and a second type of the design elements that are connected to a specific node in the circuit, and stores the gate signal name for each determined occurrence of the first type of design element in a first list. The gate signal name for each determined occurrence of the second type of design element is than stored in a second list. A value of a design element characteristic and indicia thereof for each determined occurrence of the first and the second types of the design elements is than stored. A set difference operation is preformed on the first list and the second list to determine orphan gate signal names that appear in only one said list; and a cumulative value is determined for each said design element characteristic, by adding the design element characteristic value corresponding to each stored said orphan gate signal name, to produce a total design element characteristic value.

DETAILED DESCRIPTION

Figure 1:
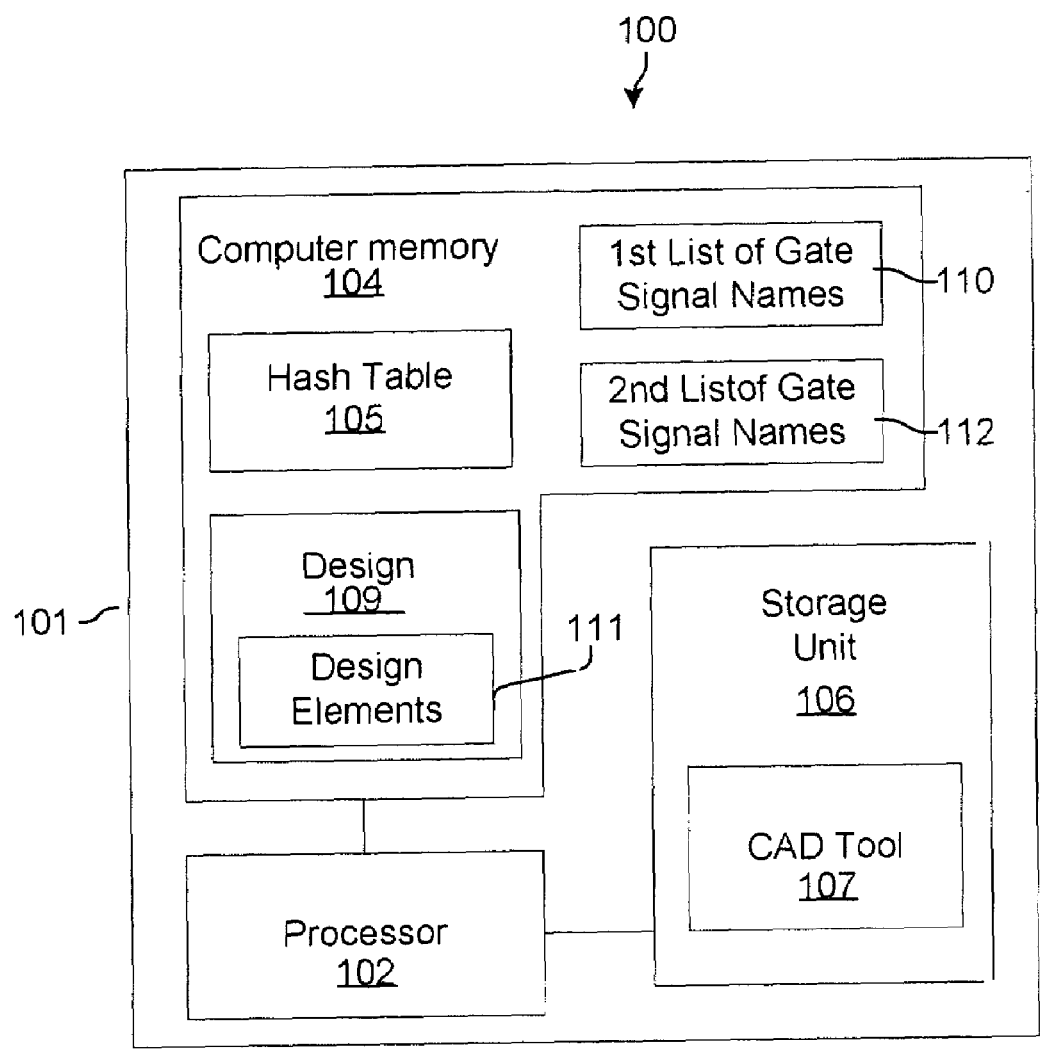
FIG. 1 shows an exemplary CAD system configured for determining unmatched design elements in accordance with one embodiment of the present method.

FIG. 1 shows a CAD system 100 configured for analyzing a plurality of design elements 111 of a design 109. As shown in FIG. 1, CAD system 100 includes computer system 101 and CAD tool 107. Computer system 101 controls CAD tool 107 to analyze design 109. Computer system 101 includes processor 102, computer memory 104, and storage unit 106. In computer system 101, processor 102 is coupled to storage unit 106 for loading CAD tool 107 into computer memory 104. Design 109, or a part thereof, is loaded in computer memory 104 upon initialization of CAD tool 107. Computer system 101 detects occurrences of first and second types of a design elements 111 connected to a particular node, and determines the net difference of a desired electrical characteristic with respect to the two design element types connected to the node.

A design element is a component of design 109. The first and the second types of design elements may be from any family of design elements used in the design of interest, with both types being from the same family. For example, an electronic design may include design elements such as transistors, wires, resistors, capacitors, power sources, and logic gates. The first and the second types of design elements may respectively be, for example, P-type and N-type MOSFETs from a design element family of transistors. A design element family is a set of two or more design elements, each of which has at least one common electrical or physical characteristic. For example, a P-type MOSFET and an N-type MOSFET may be considered as two members of a design element family. Both types of MOSFETS have common characteristics, such as MOSFET widths (explained below). In an exemplary embodiment, for a given analysis, a design element family is predetermined to consist of two design elements, each of which corresponds to the other with respect to some electrical characteristic. Therefore, an unmatched design element is a design element that does not have a corresponding design element within the design, such as a P-type MOSFET with no corresponding N-type MOSFET.

In the present system, processor 102 is configured for determining the difference between a cumulative value of a predetermined characteristic of unmatched first type of design elements connected to a given node.

In operation, processor 102 determines an applicable value of the desired characteristic of the design elements 111 and cumulatively stores the value for later calculations. The characteristic may represent, for example, a dimension of a particular design element. In an exemplary embodiment, the width of each unmatched particular type of MOSFET (e.g., a P-type MOSFET that has no corresponding connection to an N-type MOSFET) is determined for the unmatched instances of that type of MOSFET. The width of a MOSFET is a factor that determines the overall area of the MOSFET, and thus may be used, for example, to calculate a total drive fight current for a particular circuit design.

Figure 2:
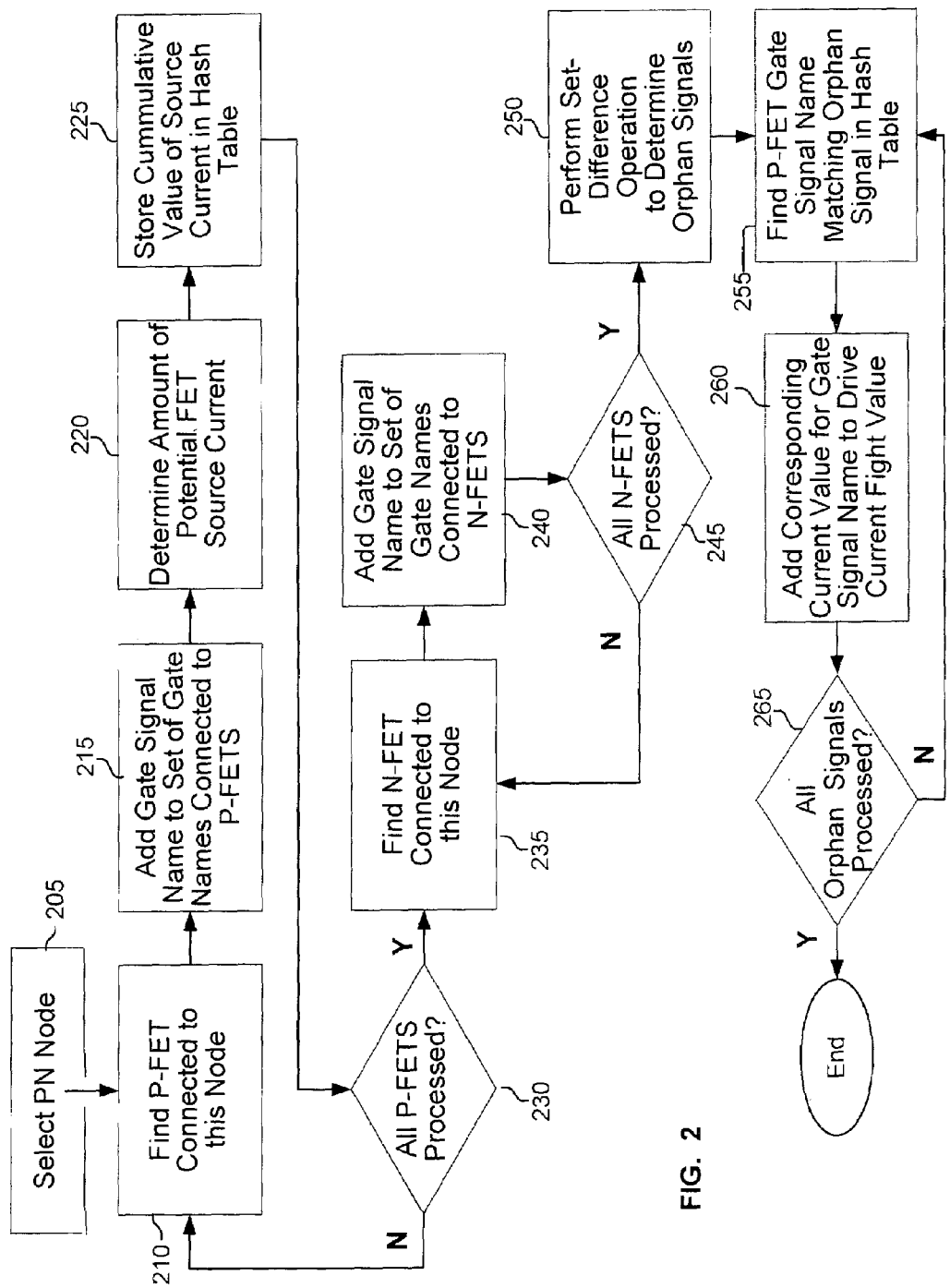
FIG. 2 is a flowchart illustrating an exemplary set of steps performed in the embodiment of the system of FIG. 1.

FIG. 2 is a flowchart illustrating an exemplary set of steps performed in one embodiment of the present system. As shown in FIG. 2, processor 102 initially selects a 'PN' node in the design 109 to be analyzed, at step 205. A PN node is a node with a connection between a P-FET and an N-FET. In steps 210–230, each instance of a P-FET connected to this PN node is found and processed by iterating over all of the design elements 111 connected to the selected node.

More specifically, for each P-FET found at step 210, the gate signal name of the P-FET is added to a first list 110 in computer memory 104, at step 215, to create a set of names of gate signals connected to P-FETs. At step 220, processor 102 determines a FET source current (the amount of current that the FET could source), by multiplying the width of the FET by a current density figure. The FET width data is part of the circuit information that exists in the data model that represents the circuit, and current density data is provided by a technology file for the process in which the chip is to be constructed. At step 225, this source current value is stored cumulatively (i.e., as a total current value) in a source current hash table 105 that associates a total current value with each P-FET gate signal name. In the present embodiment, entries are stored in hash table 105 with a key of the gate signal name and a value of the corresponding FET source current. A hash table 105 is a 'lookup' table, known in the art, that is used to facilitate the storage and retrieval of data. It should be noted that other data storage/retrieval methods and structures known in the art may, alternatively, be used to perform the function of hash table 105, by storing a characteristic value (e.g., a FET source current value) and corresponding indicia, for each signal gate name. At step 230, if all P-FETs connected to this node have not been processed, then processing continues at step 210.

Once all P-FETs connected to this node have been processed, then in steps 235–245, each instance of a N-FET connected to this PN node is found and processed by iterating over all of the design elements 111 connected to the node. More specifically, for each N-FET found at step 235, the gate signal name of the N-FET is added to a second list 112 in computer memory 104, at step 240, to create a set of names of gate signals connected to N-FETs. At step 245, if all N-FETs connected to the selected node have not been processed, then processing continues at step 235.

Once all N-FETs connected to the present node have been processed, then at step 250, a set-difference operation is performed on the two sets of gate signal names stored in lists 110 and 112, to find the names of the signals that appear in one set or the other, but not in both. These signal names denote 'orphan' signals.

At steps 255–265, a P-FET gate signal name is found for every orphan signal in source current hash table 105, and, for each of the orphan gate signal names, the source current value corresponding to the gate signal name in the hash table is added to a cumulative current value, to produce a total source current value. This total source current value represents the total drive fight current that may be sourced in this logic gate. A scaled current value may then be calculated by multiplying the total drive fight current by a scale factor indicating the length of time (as a percentage of the applicable clock cycle) that this PN node is likely to drive fight. This scaled current value represents the drive fight current on this PN node.

While the process shown in FIG. 2 illustrates an algorithm for determining unmatched P-FET current using single element N-FET stacks, the present method and system can be extended to multi-element N-FET stacks. In a multi-element N-FET stack embodiment, after steps 210–230 of FIG. 2 are performed, an iteration is performed over all the N-FETs connected to the PN node (as shown in steps 235–245 of FIG. 2), and then an iteration is continued over N-FETs following 'channel-connected' FETs, until a GND (ground) connection is encountered. Channel-connected FETs are FETs that are connected at the source or drain to another FET's source or drain terminal. The current path from source to drain of a FET is referred to as a 'channel', and thus two FETs that are connected at source and drain may be considered to be 'channel-connected.' The process is fundamentally similar to that of FIG. 2, in that the N-FET gate signal is cumulatively added to the set of N-FET gate signal names, and then the set difference operation (step 250 in FIG. 2) is performed on the two sets of gate signal names stored in lists 110 and 112. Orphan gate signals are then processed as shown in step 255–265 of FIG. 2.

Instructions that perform the operations described with respect to FIG. 2 may be stored in computer memory or other computer-readable media, and later retrieved therefrom and executed by processor 102 to operate in accordance with the present system. Examples of instructions include software, program code, and firmware. Examples of storage media include memory devices, tapes, disks, integrated circuits, and servers.

Changes may be made in the above method and system without departing from the scope hereof. It should thus be noted that that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for determining unmatched P-FETs and N-FETs in a circuit comprising the steps of:
   determining instances of said P-FETs and said N-FETs that are connected to a specific node in the circuit;
   storing a gate signal name for each determined said instance of one of said P-FETs in a first list;
   storing the gate signal name for each determined said instance of one of said N-FETs in a second list;

storing a cumulative value representing a source current for each determined said instance of said P-FETs and said N-FETs;

performing a set difference operation on the first list and the second list to determine orphan gate signal names that appear in either one of the lists but not in both; and determining a cumulative value for said source current, by summing the source current value corresponding to each said P-FET gate signal name that matches one of said orphan gate signal names, to produce a total source current value.

2. The method of claim 1, wherein said cumulative value representing a source current is stored in a hash table, with a key of the gate signal name and a value of the source current for the determined said instance.

3. The method of claim 1, wherein said specific node corresponds to a first terminal of said N-FET, and wherein said processor iteratively determines instances of other said N-FETs that are channel-connected to said specific node, until a ground connection is encountered.

4. The method of claim 3, wherein said first terminal is a source terminal and said second terminal is a drain terminal.

5. The method of claim 3, wherein said first terminal is a drain terminal and said second terminal is a source terminal.

6. A method for determining unmatched design elements in a circuit comprising the steps of:

determining instances of a first type and a second type of the design elements that are connected to a specific node in the circuit;

storing a gate signal name for each determined said instance of the first type of design element in a first list;

storing the gate signal name for each determined said instance of the second type of design element in a second list;

determining a cumulative design element characteristic value by summing a design element characteristic for each determined said instance of the first and the second types of the design elements;

storing the cumulative design element characteristic value in association with the gate signal name;

performing a set difference operation on the first list and the second list to determine orphan gate signal names that appear in either one of the lists but not in both; and determining a cumulative value for said design element characteristic, by summing the design element characteristic value corresponding to each said first type of design element gate signal name that matches one of said orphan gate signal names, to produce a total design element characteristic value.

7. The method of claim 6, wherein said cumulative design element characteristic value for each determined said instance of the first and the second types of the design elements is stored in a hash table.

8. The method of claim 6, wherein the first and the second types of the design elements are selected from a family of design elements consisting of transistors, wires, capacitors, resistors, and power sources.

9. A system for determining unmatched design elements in a circuit, comprising:

means for determining instances of said P-FETs and said N-FETs that are connected to a specific node in the circuit;

means for storing a gate signal name for each determined said instance of one of said P-FETs in a first list;

means for storing the gate signal name for each determined said instance of one of said N-FETs in a second list;

means for storing a cumulative value representing a source current for each determined said instance of said P-FETs and said N-FETs;

means for performing a set difference operation on the first list and the second list to determine orphan gate signal names that appear in either one of the lists but not in both; and means for determining a cumulative value for said source current, by summing the source current value corresponding to each said P-FET gate signal name that matches one of said orphan gate signal names, to produce a total source current value.

10. A system for determining unmatched design elements in a circuit design, comprising:

a processor for determining instances of P-FETs and N-FETs that are connected to a specific node in the circuit design;

a first list, located in memory coupled to said processor, for storing a gate signal name for each determined said instance of one of said P-FETs;

a second list, located in said memory coupled to said processor, for storing the gate signal name for each determined said instance of one of said N-FETs in a second list;

a storage mechanism for storing a cumulative value representing a source current for each determined said instance of said P-FETs and said N-FETs;

wherein said processor performs a set difference operation on the first list and the second list to determine orphan gate signal names that appear in either one of the lists but not in both; and wherein said processor determines a cumulative value for said source current, by summing the source current value corresponding to each said P-FET gate signal name that matches one of said orphan gate signal names, to produce a total source current value.

11. The system of claim 10, wherein said storage mechanism is a hash table, with a key of the gate signal name and a value of the source current for the determined said instance.

12. The system of claim 10, wherein said specific node corresponds to a first terminal of said N-FET, and wherein said processor iteratively determines instances of other said N-FETs that are channel-connected to said specific node, until a ground connection is encountered.

13. The system of claim 12, wherein said first terminal is a source terminal and said second terminal is a drain terminal.

14. The system of claim 12, wherein said first terminal is a drain terminal and said second terminal is a source terminal.

15. A software product comprising instructions, stored on computer-readable media, wherein the instructions, when executed by a computer, perform steps for determining unmatched P-FETs and N-FETs in a circuit comprising:

determining instances of said P-FETs and said N-FETs that are connected to a specific node in the circuit;

storing a gate signal name for each determined said instance of one of said P-FETs in a first list;

storing the gate signal name for each determined said instance of one of said N-FETs in a second list;

storing a cumulative value representing a source current for each determined said instance of said P-FETs and said N-FETs;

performing a set difference operation on the first list and the second list to determine orphan gate signal names that appear in either one of the lists but not in both; and determining a cumulative value for said source current, by summing the source current value corresponding to each said P-FET gate signal name that matches one of said orphan gate signal names, to produce a total source current value.

* * * * *